US006764916B1

(12) United States Patent
Furukawa et al.

(10) Patent No.: US 6,764,916 B1
(45) Date of Patent: Jul. 20, 2004

(54) MANUFACTURING METHOD FOR SEMICONDUCTOR DEVICE

(75) Inventors: Ryoichi Furukawa, Tokyo (JP); Tadanori Yoshida, Saitama (JP); Masayuki Tsuneda, Tokyo (JP); Yasuhiro Inokuchi, Tokyo (JP); Satoru Tagami, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 09/408,327

(22) Filed: Sep. 29, 1999

(30) Foreign Application Priority Data

Mar. 23, 1999 (JP) .............................................. 11-077159

(51) Int. Cl.[7] .......................................... H01L 21/8242
(52) U.S. Cl. ...................... 438/398; 438/240; 438/253; 438/396; 438/255
(58) Field of Search ........................ 438/3, 240, 253, 438/396, 255, 398

(56) References Cited

U.S. PATENT DOCUMENTS

| | | | | |
|---|---|---|---|---|
| 5,352,623 A | * | 10/1994 | Kamiyama | 438/396 |
| 5,407,534 A | * | 4/1995 | Thakur | 438/398 |
| 5,486,488 A | * | 1/1996 | Kamiyama | 438/396 |
| 5,554,557 A | * | 9/1996 | Koh | 438/398 |
| 5,650,351 A | * | 7/1997 | Wu | 438/398 |
| 5,677,015 A | * | 10/1997 | Hasegawa | 427/576 |
| 5,723,379 A | * | 3/1998 | Watanabe et al. | 438/398 |
| 5,885,867 A | * | 3/1999 | Shin et al. | 438/255 |
| 6,228,702 B1 | * | 5/2001 | Hirota | 438/240 |

FOREIGN PATENT DOCUMENTS

| | | |
|---|---|---|
| JP | 05-102422 | 4/1993 |
| JP | 05-299365 | 11/1993 |
| JP | 06-158328 | 6/1994 |
| JP | 6-196654 | 7/1994 |
| JP | 07-221201 | 8/1995 |
| JP | 10-209397 | 8/1998 |
| JP | 10-223856 | 8/1998 |
| JP | 10-233493 | 9/1998 |
| JP | 11-017153 | 1/1999 |
| JP | 11-040763 | 2/1999 |
| JP | 11-040774 | 2/1999 |
| JP | 2000-200883 | 7/2000 |

OTHER PUBLICATIONS

Kwon et al. "Ta2O5 Capacitors for 1Gbit DRAM and Beyond", IEEE, pp. 835–842, 1994.*
Wolf et al., "Chemical Vapor Deposition of Amorphous and Polycrystalline Films," Silicon Processing for the VLSI Era, vol. 1—Process Technology, pp. 169–170, 1986.*

* cited by examiner

Primary Examiner—Mary Wilczewski
Assistant Examiner—Toniae M. Thomas
(74) Attorney, Agent, or Firm—Hogan & Hartson, LLP

(57) ABSTRACT

A manufacturing method for a semiconductor device, including forming on or above a semiconductor substrate a silicon film a surface of which has a first polycrystalline silicon film with mushroom or hemisphere-shaped crystal grains, and forming a $Ta_2O_5$ film on the silicon film at a pressure of 40 Pa or lower and at a temperature of 480° C. or lower, using a gas obtained by vaporizing $Ta(OC_2H_5)_5$ as a tantalum source gas.

14 Claims, 5 Drawing Sheets

US 6,764,916 B1

MANUFACTURING METHOD FOR SEMICONDUCTOR DEVICE

BACKGROUND OF THE INVENTION

1. Field of the Invention

The present invention relates to a manufacturing method for a semiconductor device and more particularly, to a manufacturing method for a semiconductor device using, as a capacitance film of a capacitor of a memory cell, a $Ta_2O_5$ film which is a dielectric having a high dielectric constant.

2. Description of the Related Art

With the increase of integration density of a DRAM (Dynamic Random-Access Memory) which is a kind of semiconductor memory devices, it has been studied to use a $Ta_2O_5$ film having a high dielectric constant, as a capacitance film of a capacitor of its memory cell. A dielectric capacitance film used for a capacitor of a DRAM is required to have high uniformity of film thickness and an excellent step coverage.

SUMMARY OF THE INVENTION

According to a first aspect of the present invention, there is provided a manufacturing method for a semiconductor device, including:

forming a silicon film on or above a semiconductor substrate, a surface of the silicon film having a first polycrystalline silicon film having mushroom or hemisphere-shaped crystal grains; and forming a $Ta_2O_5$ film on the silicon film at a pressure of 40 Pa or lower and at a temperature of 480° C. or lower, using a gas obtained by vaporizing $Ta(OC_2H_5)_5$ as a tantalum source gas.

According to a second aspect of the present invention, there is provided a manufacturing method for a semiconductor device, including:

forming an undulating film having a surface with concave-convex structure on or above a semiconductor substrate; and forming a $Ta_2O_5$ film on the undulating film at a pressure of 40 Pa or lower and at a temperature of 480° C. or lower, using a gas obtained by vaporizing $Ta(OC_2H_5)_5$ as a tantalum source gas.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
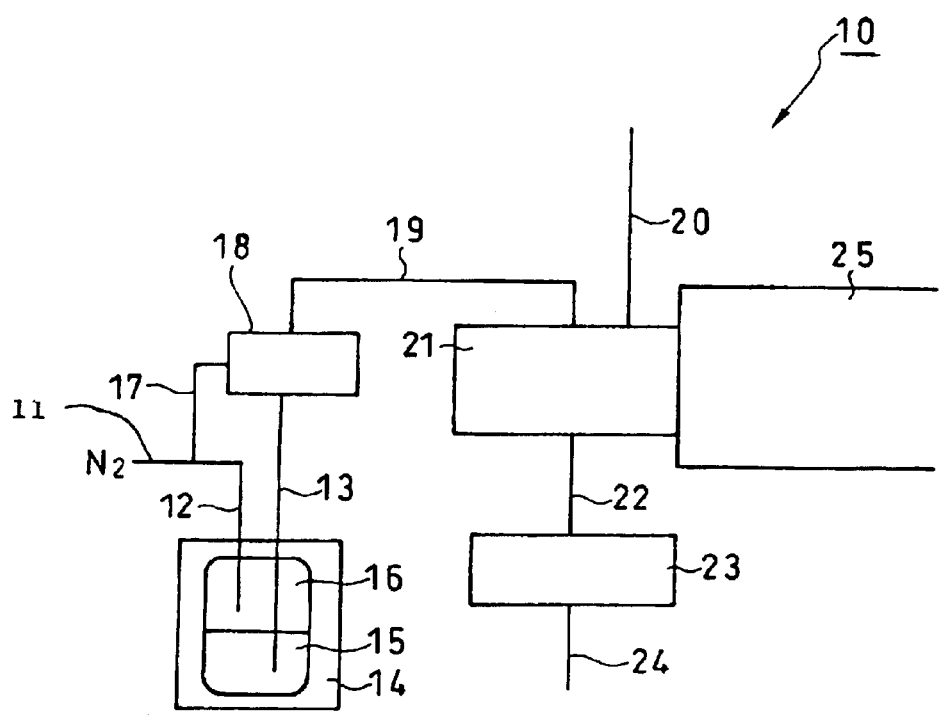
FIG. 1 is a schematic block diagram for explaining $Ta_2O_5$ film forming CVD (Chemical Vapor Deposition) apparatus preferably used in the present invention.

FIG. 1 shows a general outline of a CVD apparatus 10, preferably used in the present invention, having a hot wall CVD furnace and a gas supplying system for supplying source gases. In the case of a hot wall type CVD apparatus, since a wafer and an inner wall of a reaction furnace are brought into a thermal equilibrium state, wafer temperature is kept constant at the same temperature as that of the inner wall of the reaction furnace irrespective of kinds of films and thus, the hot wall type CVD apparatus is excellent in temperature uniformity and temperature stability. As a result, it is possible to uniformalize the temperature within a wafer surface.

As a tantalum source material for forming a $Ta_2O_5$ film, $Ta(OC_2H_5)_5$ is used. $Ta(OC_2H_5)_5$ will be abbreviated as "PETa" hereinafter. Since PETa is liquid at room temperature, it is heated and vaporized by a vaporizer 18, mixed with carrier gas $N_2$, and supplied to a reaction chamber 21 through a heated tube 19.

The hot wall type CVD apparatus 10 comprises $N_2$ supplying tubes 11, 12, 17, a PETa supplying tube 13 a thermostatic chamber 14, a PETa liquid source 15, a PETa tank 16, the vaporizer 18, a heated supplying tube 19, an $O_2$ supplying tube 20, the reaction chamber 21, a discharging tube 22, a pump 23, an atmospheric pressure discharging tube 24 and a wafer transfer chamber 25.

Figure 5:
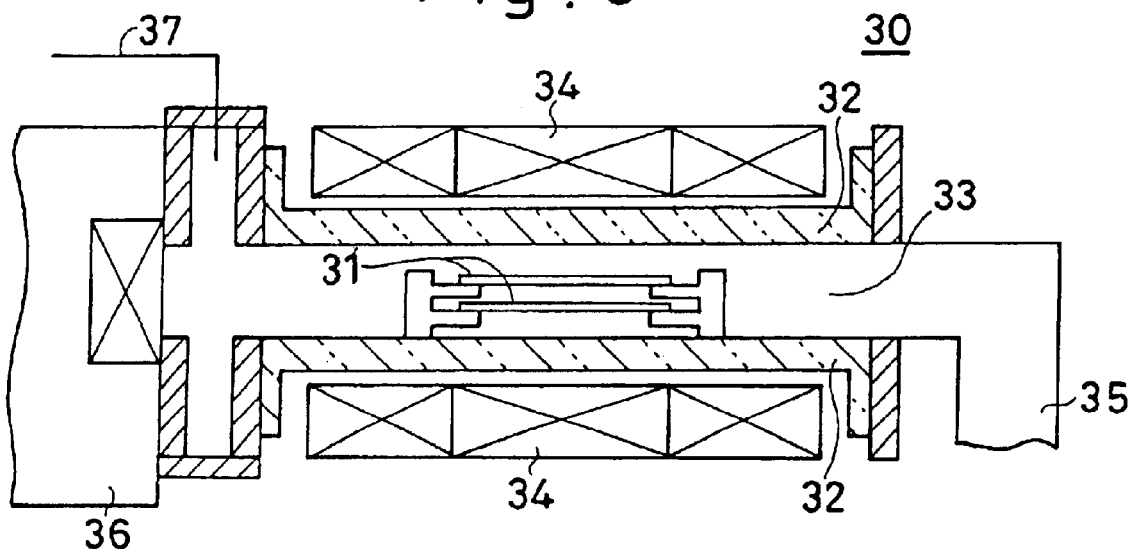
FIG. 5 is a schematic longitudinal sectional view for explaining an HSG film forming CVD apparatus preferably used in the present invention.

$N_2$ carrier gas supplied from the $N_2$ supplying tube 11 is branched into the $N_2$ supplying tubes 12 and 17. The $N_2$ carrier gas is introduced into the PETa tank 16 through the $N_2$ supplying tube 12, thereby pushing out the PETa liquid source 15 in the PETa tank 16 into the PETa supplying tube 13. Temperature of the PETa tank 16 is controlled by the thermostatic chamber 14. The PETa liquid source 15 is supplied to the vaporizer 18 from the PETa supplying tube 13 and $N_2$ carrier gas is supplied to the vaporizer 18 through the $N_2$ supplying tube 17. PETa source gas vaporized by the vaporizer 18 and $N_2$ carrier gas are introduced into the reaction chamber 21 through the heated supplying tube 19. $O_2$ gas is also introduced into the reaction chamber 21 through the $O_2$ supplying tube 20. A heater (not shown) and a heat insulator (not shown) are provided around the reaction chamber 21 such as to form a hot wall type CVD furnace. The wafer is transferred into and out from the reaction chamber 21 through the wafer transfer chamber 25. The discharging tube 22, the pump 23, and the atmospheric pressure discharging tube 24 are connected to the reaction chamber 21 in this order so as to evacuate the reaction chamber 21. The following data concerning $Ta_2O_5$ are obtained using this apparatus shown in FIG. 1. The hot wall type CVD apparatus 10 is similar in structure to a hot wall type CVD apparatus shown in FIG. 5.

According to a design rule after 64 Mbits generation of the DRAM, precision of a substrate surface in its thickness direction is required under constraints of performance of an apparatus used for lithography process together with necessity of three-dimensional working. Therefore, it is necessary to limit variation of the film thickness to about ±3% or less over the wafer surface. In order to limit variation of the film thickness to about ±3% or less over the wafer surface, it is necessary to carry out the CVD in a surface reaction rate-determining temperature region. For this purpose, it is necessary to prevent a CVD raw material from being decomposed and reacting in a vapor phase, and the deposition temperature has an upper limit.

In the case of the $Ta_2O_5$ film forming by CVD, when the film forming temperature rises to a high temperature, a film forming mechanism is changed from a reaction rate-determining mechanism to a raw material supply rate-determining mechanism. In the raw, material supply rate-determining temperature region, the raw material is decomposed and reacts in a vapor phase and as a result, deposition from above become dominant in a film growing mechanism onto the wafer surface, which makes it impossible to keep the uniformity of film thickness within about ±3%.

Figure 2:
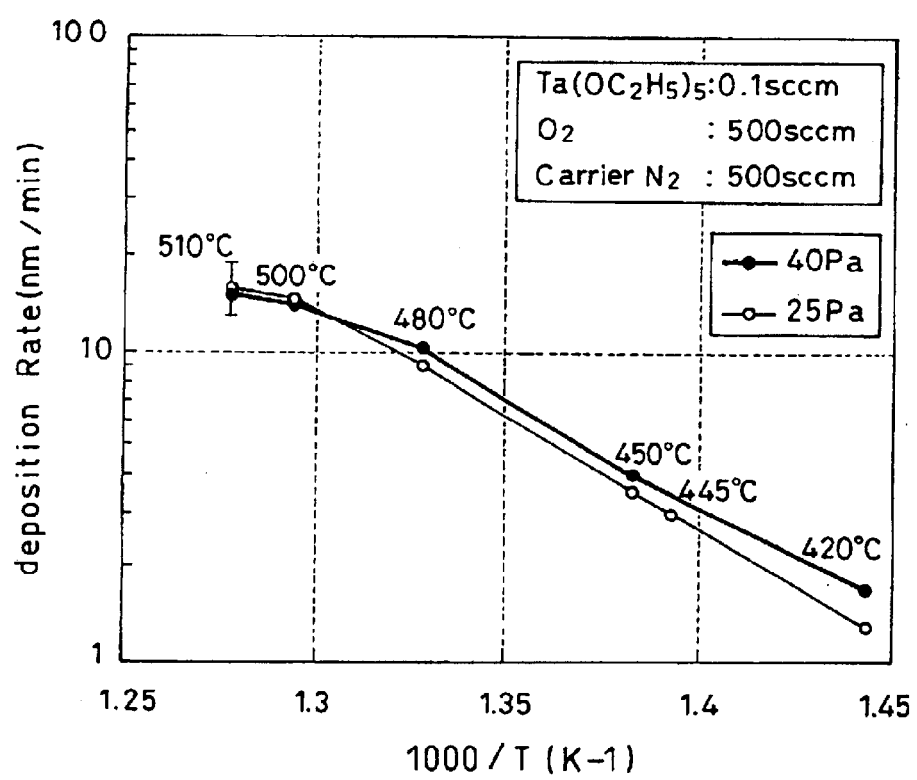
FIG. 2 is an Arrhenius plot between a deposition temperature and a deposition rate.

FIG. 2 is an Arrhenius plot of data obtained using the apparatus shown in FIG. 1. It can be seen from FIG. 2 that transition points of the above-described film forming mechanism exist at a temperature of 480° C. at a pressure of 40 Pa, and at the temperature of 500° C. at a pressure of 25 Pa. Therefore, in order to secure the uniformity of the film thickness, it is preferable to form a film at least at 480° C. or lower. The shown data were obtained under the conditions that $Ta(OC_2H_5)_5$ was used as the liquid source 15 for forming a $Ta_2O_5$ film, and the $Ta(OC_2H_5)_5$ was supplied to the vaporizer 18 from the PETa supplying tube 13 at 0.1 sccm, $N_2$ carrier gas was supplied to the vaporizer 18 from the $N_2$ supplying tube 17 at 500 sccm, the $Ta(OC_2H_5)_5$ source gas vaporized by the vaporizer 18 was supplied to the reaction chamber 21, the $O_2$ gas was supplied into the reaction chamber at 500 sccm through the $O_2$ supplying tube 20, and pressure and temperature in the reaction chamber 21 were kept at values shown in FIG. 2.

Further, in addition to the above, in the DRAM process, required step coverage characteristics of the dielectric film are severer than those in process of older generation. This is because that in the generation of 64 Mbits and 256 Mbits, it is general to use an HSG (Hemispherical Grain) electrode as a capacitor lower electrode. In the case of the HSG, the amorphous Si surface is formed into a concavo-convex shape so as to increase the electrode area for increasing the capacitance. However, the HSG has a mushroom-like shape cross section, and in order to excellently cover the HSG up to the constricted root portion thereof with the CVD film, a step coverage of 85% or more at an aspect ratio of at least 4 (if expressed with an aspect ratio of a conventional trench groove) is preferable.

Figure 3:
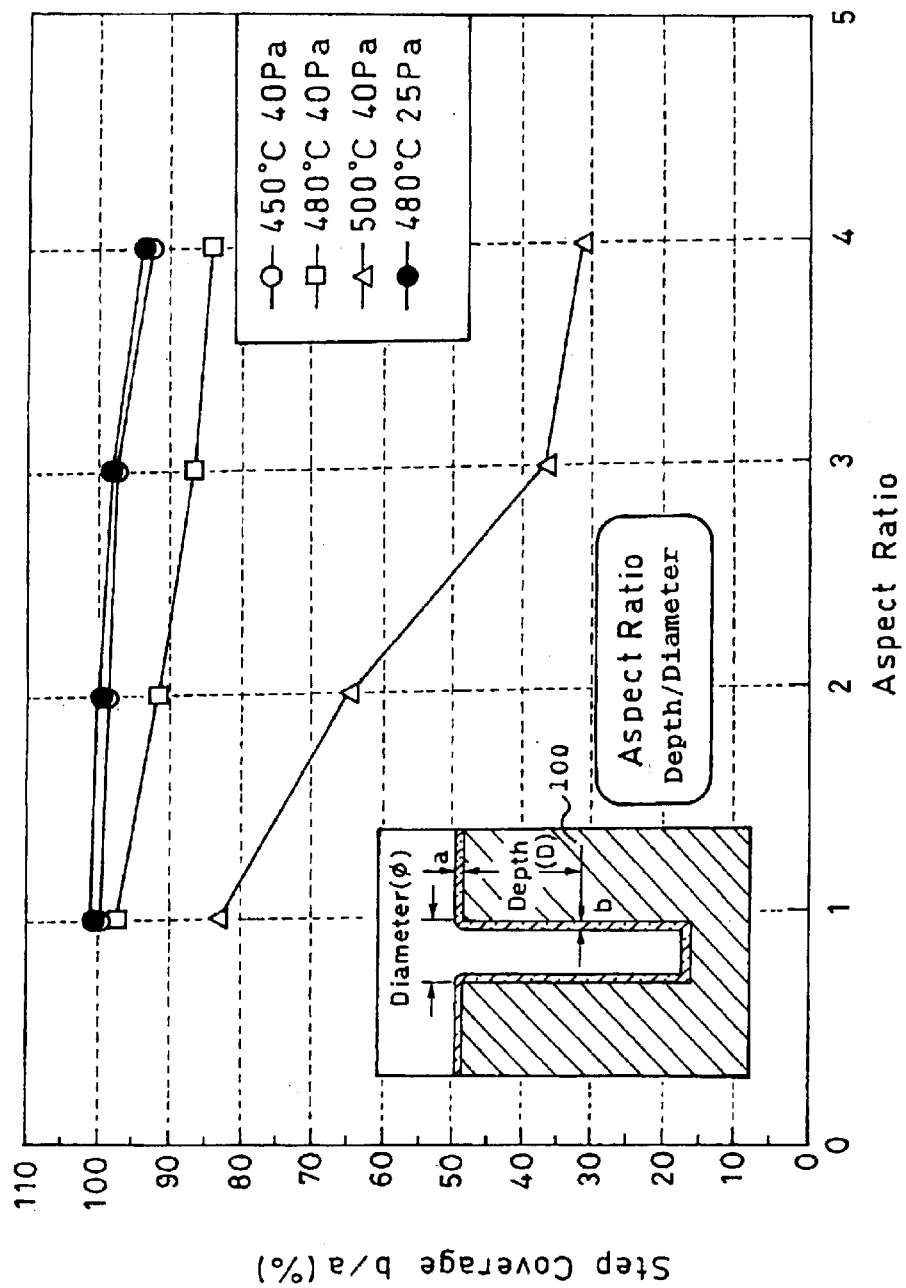
FIG. 3 is a step coverage characteristic plot showing the relation between an aspect ratio and a step coverage.

FIG. 3 shows step coverage characteristics of a $Ta_2O_5$ film manufactured using a $Ta(OC_2H_5)_5$ as a tantalum liquid source for forming the $Ta_2O_5$ film. It appears remarkably when the aspect ratio is 4 that the higher the temperature or pressure is, the poorer the step coverage is. Practically, the step coverage of 85% or higher is desired, but even at 480° C., the step coverage becomes about 85% at a pressure of 40 Pa. If the pressure is reduced down to 25 Pa, the step coverage is improved to about 93%. Therefore, in order to obtain a practical step coverage, it is preferable that the pressure is 40 Pa or lower and the deposition temperature is 480° C. or lower.

A substantial pressure reduction to 25 Pa or lower, however, requires a high rate of deposition gas flow and reduces the deposition rate and thus, an amount of the source gas that does not contributes to deposition is increased and as a result, a consumption amount of the source gas is increased. Further, time required for obtaining the same film thickness is increased and thus, the throughput is deteriorated. The PETa is extremely expensive as generally known and as a result, increased consumption amount of the PETa deteriorates commercial profit. Therefore, it is not practically preferable to reduce the pressure to be lower than 25 Pa. Here, the aspect ratio means a ratio (D/φ) of a depth D to a diameter φ of a groove formed in a wafer 100, and the step coverage means a ratio (b/a) of a film thickness b at the depth D of a $Ta_2O_5$ film formed on a side surface in the groove to a film thickness a of a $Ta_2O_5$ film formed on a surface of the wafer 100. In FIG. 3, the film thickness a of the $Ta_2O_5$ film formed on the surface of the wafer 100 is 10 nm, and the diameter φ of the groove is 100 nm.

Leakage current flowing through the $Ta_2O_5$ film depends on carbon density in the film. In order to reduce the carbon density to a small value for reducing the leakage current, deposition at high temperature is desirable.

Figure 4:
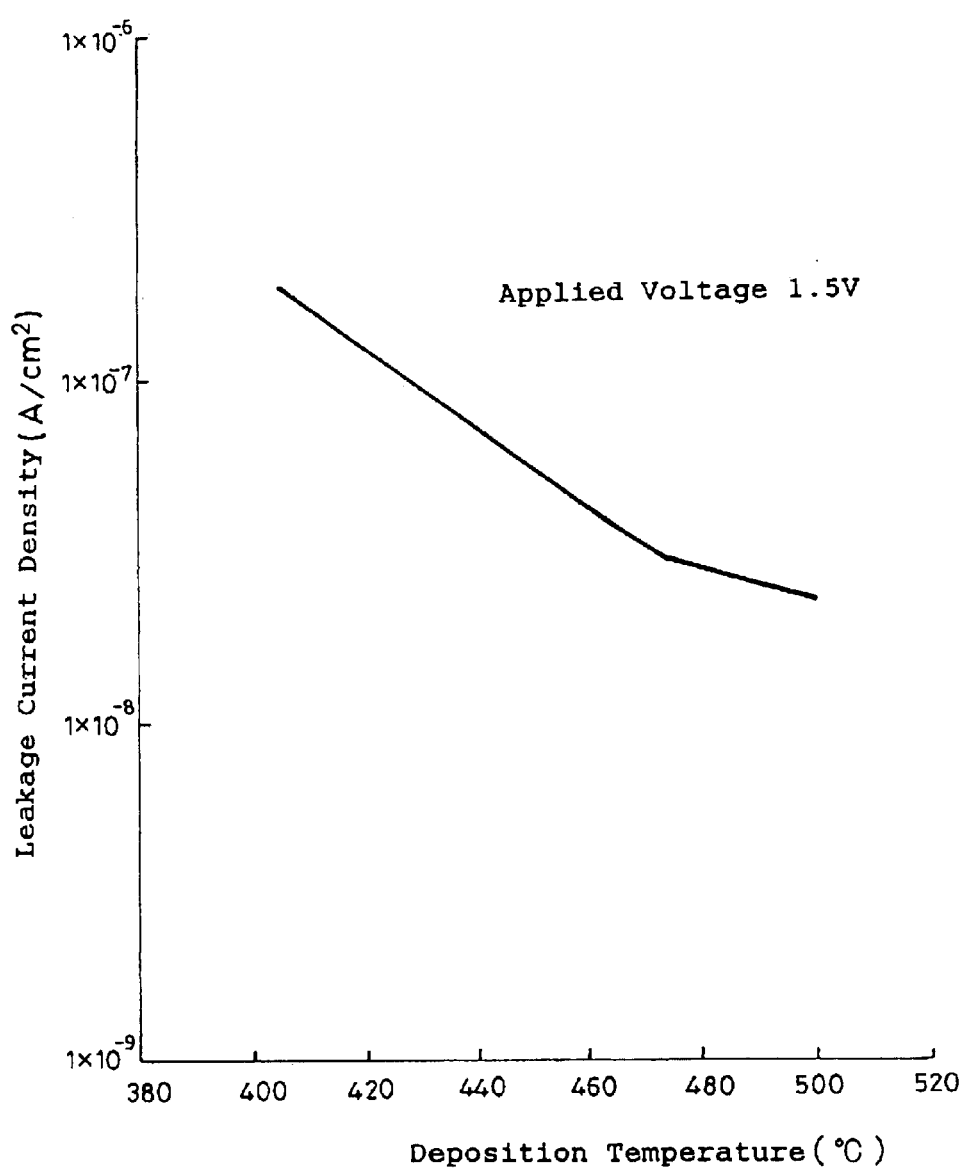
FIG. 4 is a leakage current characteristic plot showing the relation between a deposition temperature and a leakage current density.

FIG. 4 shows characteristics between the deposition temperature and the leakage current. As the deposition temperature rises, the leakage current is reduced. Therefore, in the temperature range shown in FIG. 4, deposition of higher temperature is more preferable. If practical leakage current is of the order of $10^{-8}$ $A/cm^2$ at an applied voltage of 1.5 volts, 430° C. or higher is preferable. The value of this leakage current was obtained after the $Ta_2O_5$ film was deposited and then subjected to $O_2$ anneal for crystallization. The $O_2$ anneal was carried out at the temperature of 800–850° C. under atmospheric pressure for 20 minutes. An $O_2$ anneal stabilizes, the temperature characteristics and reduces defects in the crystal and the leakage current due to carbon in the film, but since the leakage current due to carbon in the film can not be reduced sufficiently by the $O_2$ anneal, it preferable to deposit the $Ta_2O_5$ film at 430° C. or higher.

The above information can be summarized as follow. That is, in order to realize $Ta_2O_5$ film characteristics required for a DRAM of 64 Mbits using a $Ta(OC_2H_5)_5$ as a tantalum source liquid for forming the $Ta_2O_5$ film, it is especially preferable to deposit the $Ta_2O_5$ film at a pressure of 25 to 40 Pa at the temperature of 430 to 480°, and it is possible to realize a leakage current characteristics of the order of $10^{-8}$ $A/cm^2$ at applied voltage of 1.5 volts, a step coverage of 85% or greater at the aspect ratio 4, and the film thickness uniformity of ±3%.

The above-described HSG film is suitably used for increasing a capacitance by changing an amorphous silicon film into a largely undulated silicon film (for providing its surface with a concavo-convex structure) thereby enlarging the surface area thereof during a process for forming a capacitance electrode portion of a semiconductor device such as a DRAM.

This HSG film is preferably formed utilizing generally known nucleation method using raw material such as $SiH_4$.

In a preferable method for manufacturing an HSG film, an amorphous silicon film is formed on or above a substrate, then a plurality of crystal nuclei are generated at a plurality of portions of a surface of the amorphous silicon film by heating the amorphous silicon film in a vacuum or in a gas atmosphere substantially chemically non-reactive to the amorphous silicon film, and thereafter, the crystal nuclei are made to growl by heating the amorphous silicon film having the crystal nuclei in a vacuum or in a gas atmosphere substantially chemically non-reactive to the amorphous silicon film; to convert the surface of the amorphous silicon film into the polycrystalline silicon film having mushroom or hemisphere shaped crystal grains.

In another preferable method for manufacturing an HSG film, an amorphous silicon film is formed on or above a substrate, then a plurality of crystal nuclei are generated at a plurality of portions of a surface of the amorphous silicon film by heating the amorphous silicon film in an atmosphere including a silicon-containing compound such as an $SiH_4$, and thereafter, the crystal nuclei are made to grow, by heating the amorphous silicon film having the crystal nuclei after terminating the supply of the silicon-containing compound, preferably in a vacuum or in a gas atmosphere substantially chemically non-reactive to the amorphous silicon film, to convert the surface of the amorphous silicon film into the polycrystalline silicon film having mushroom or hemisphere shaped crystal grains.

U.S. Pat. No. 5,385,863, the disclosure of which is herein incorporated by reference, discloses a method for manufacturing such HSG films.

First Embodiment

Using the hot wall type CVD furnace shown in FIG. 1, deposition of the $Ta_2O_5$ film was carried out. Deposition conditions at that time were as shown in the following table 1.

TABLE 1

| Process conditions | |
| --- | --- |
| Temperature: | 470° C. |
| Source gas: | $Ta(OC_2H_5)_5$ |
| | $O_2$ |
| Deposition gas flow rate: | |
| $Ta(OC_2H_5)_5$: | 0.1 sccm |
| Carrier gas: | 500 sccm |
| $O_2$: | 500 sccm |
| Deposition pressure: | 25 Pa |

First, a $Ta_2O_5$ film was formed onto a bare—Si substrate, and the film characteristics were evaluated. The deposition rate at this time was 6.0 nm/minite, and the film thickness uniformity within the wafer surface was as excellent as ±2.7%.

Next, the leakage current was evaluated by forming a capacitor TEG (Test Element Group) Results thereof are shown in Table 2. The leakage current density was $3 \times 10^{-8}$ A/cm² at applied voltage of +1.5 volts. In the capacitor TEG used here, a $Ta_2O_5$ film was formed on a polycrystal silicon film. The film forming condition of the $Ta_2O_5$ film was the same as that onto the bare—Si substrate. Further, anneal was carried out after deposition of the $Ta_2O_5$ film.

TABLE 2

| Applied voltage (v) | Leakage current (A/cm²) |
| --- | --- |
| 0 | $4 \times 10^{-12}$ |
| 0.4 | $1.2 \times 10^{-11}$ |
| 0.8 | $6 \times 10^{-11}$ |
| 1.2 | $4 \times 10^{-10}$ |
| 1.5 | $3 \times 10^{-8}$ |
| 1.8 | $1 \times 10^{-6}$ |

A shallow trench was formed in a bare—Si wafer for evaluating the step coverage, and a cross section was observed by a scanning electron microscope. The groove had a diameter of φ400 nm. As a result, it was confirmed that the step coverage was 98% even when the aspect ratio was 4.

Second Embodiment

Deposition was carried out under process conditions shown in Table 3 which were different from those in the first embodiment.

TABLE 3

| Process conditions | |
| --- | --- |
| Temperature: | 450° C. |
| Source gas: | $Ta(OC_2H_5)_5$ |
| | $O_2$ |
| Deposition gas flow rate: | |
| $Ta(OC_2H_5)_5$: | 0.1 sccm |
| Carrier gas: | 500 sccm |
| $O_2$: | 500 sccm |
| Deposition pressure: | 40 Pa |

The present embodiment is suitable f or the device in which a capacitor electrode is made of HSG, and the deposition is carried out such that the step coverage is enhanced in this embodiment. Since the HSG has a mushroom-like shape cross section, and it has a tendency that the coverage of the HSG, especially at its mushroom shaped constricted root portion, is deteriorated. In order to uniformly cover this portion, the temperature is lowered such that the surface reaction can be more rate-determining. First, a film was formed on the bare—Si substrate, and the film characteristics were evaluated. The deposition rate on the bare—Si substrate at this time was 4.5 nm/minute. In order to prevent the deposition rate from being lowered, the deposition pressure was set to 40 Pa. Next, as in the first embodiment, the leakage current was evaluated by capacitor TEG. In the capacitor TEG of the present embodiment, $Ta_2O_5$ film was formed on an HSG film. The film formation condition of the $Ta_2O_5$ film was the same as that of the film formation onto the bare—Si substrate. Anneal was carried out after deposition of the $Ta_2O_5$ film. HSG in the capacitor TEG of the present embodiment was formed in the following manner using a hot wall type CVD apparatus 30 of a structure shown in FIG. 5.

In this CVD apparatus 30, heaters 34 are provided above and below a reaction tube 32, respectively. A heat insulator (not shown) is provided such as to cover the heaters 34 and the reaction tube 32. A reaction chamber 33 is formed in the reaction tube 32, one side of the reaction chamber 33 is connected to an $SiH_4$ gas supplying nozzle 37, and the other side is in communication with a discharging tube 35. The side of the reaction chamber 33 to which the $SiH_4$ gas supplying nozzle 37 is connected is connected to a transfer chamber 36.

First, a wafer on which an amorphous silicon film is formed is cleaned and dried and then, the wafer is transferred into the reaction chamber 33 through the transfer chamber 36 of the CVD apparatus 30. The transferred wafer 31 is stabilized in temperature at a preset reaction chamber temperature (600 to 620° C.). The atmosphere at this time is high vacuum or non-reactive gas atmosphere such as nitrogen and inert gas which does not react with amorphous silicon surface. Here, it is preferable that the time for stabilizing the temperature is about 5 minutes in order not only to stabilize the temperature in the surface of the wafer but also not to hinder the HSG formation by polycrystallization of the backing amorphous silicon. The subsequent processing is carried out while keeping this reaction chamber temperature.

Next, mono-silane is allowed to flow through the $SiH_4$ gas supplying nozzle 37 for 2 to 2.5 minutes at a flow rate of 50 to 200 cc per minute, thereby forming (generating) fine crystal nuclei on the amorphous silicon surface. There is a tendency that the density of the crystal nuclei is increased as the wafer temperature or nucleation time is increased. When the flow rate of mono-silane is reduced, the density of the crystal nuclei becomes smaller and thus, it is necessary to increase the forming time of the crystal nuclei.

Lastly, the supply of mono-silane is stopped to allow the crystal nuclei formed on the amorphous silicon surface to enlarge (grow) by migration of silicon atoms. There is a tendency that the crystal grain is increased in size as the growing time of grain is increased, and the growth of the grain reaches substantially the maximum level for 5 minutes, and therefore the growing time is controlled to be 3 to 5 minutes. If the growing time is too long, grains coalesce to each other into a greater grain, which lowers the increasing rate of the surface area which is the object of the present invention. Therefore, it is necessary to control the growing time.

As a concrete example, stable HSG having an excellent uniform thickness over the wafer surface was formed under conditions that reaction chamber temperature was 610° C., temperature stabilization time was 5 minutes, mono-silane flow rate was 200 sccm, nucleation time was 2 minutes, and grain growing time was 3 minutes. Further, the same result was obtained under conditions that reaction chamber temperature was 610° C., temperature stabilization time was 5 minutes, mono-silane flow rate was 50 sccm, nucleation time was 2.5 minutes, and grain growing time was 5 minutes. Leakage current of the capacitor TEG produced by the above-mentioned method was evaluated. The result was substantially the same as that of the first embodiment, i.e., the leakage current was $5 \times 10^{-8}$ A/cm$^2$ at applied voltage of 1.5 volts. From the result of leakage current, it can be said that the mushroom shaped constricted root portion of the HSG was uniformly covered with $Ta_2O_5$. That is, a trouble that the $Ta_2O_5$ film thickness at this mushroom shaped constricted root portion became thin, and the electric field was increased and the leakage current was increased, was avoided as desired.

Figure 6A:
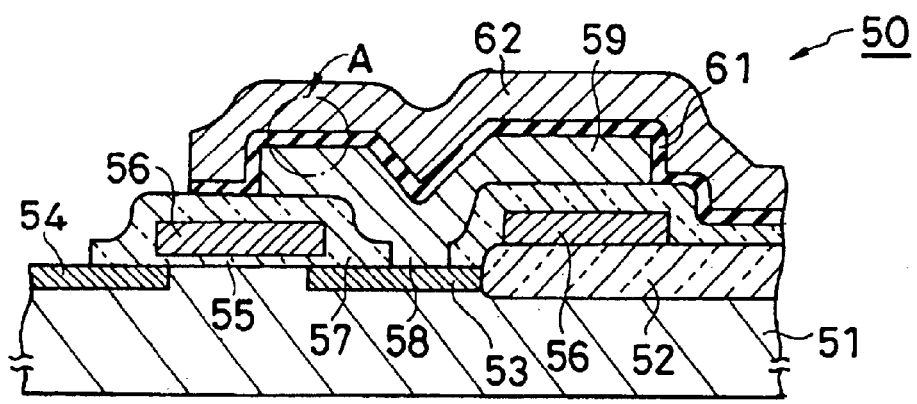
FIG. 6A is a schematic longitudinal sectional view for explaining a DRAM to which the present invention is preferably applied.
Figure 6B:
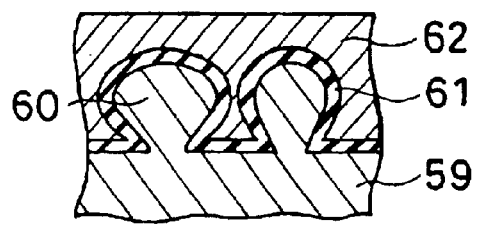
FIG. 6B is a enlarged fragmentary cross sectional view of the part A of FIG. 6A.

Next, with reference to FIGS. 6A and 6B, a manufacturing method of a DRAM having a capacitor cell to which the present invention is preferably applied will be explained. Referring to FIG. 6A, a field oxide film 52 is formed on a surface of a silicon substrate 51, and a large number of transistor forming regions are separately formed. A gate oxide film 55 is formed in each of the transistor forming regions, and a gate electrode 56 is formed thereon. Using the gate electrode 56 and the field oxide film 52 as mask, impurities are introduced into the surface of the silicon substrate 51 by ion implantation to form a source 53 and a drain 54 in a self alignment manner. Thereafter, an interlayer insulation film 57 is formed and then, a contact hole 58 for exposing the source 53 is formed in the interlayer insulation film 54. Next, amorphous silicon film is deposited on the interlayer insulation film 54, patterning is carried out, natural oxide film of amorphous silicon film is removed, poly-crystallization is carried out to form a capacitance lower electrode 59. At the time of this polycrystallization processing, as shown in FIG. 6B, largely undulated hemispherical crystal grains (HSG) 60 are formed on a surface of the amorphous silicon film 59, thereby enlarging the surface area.

Then, a capacitance insulation film 61 made of $Ta_2O_5$ is formed and an upper capacitance electrode 62 made of poly-crystalline silicon film or the like is formed thereon. In this manner, it is possible to realize a DRAM in which the capacitor cell is connected to the source 53 of a MOS transistor.

What is claimed is:

1. A manufacturing method for a semiconductor device, comprising:

forming a silicon film on or above a semiconductor substrate, a surface of the silicon film having a first polycrystalline silicon film having mushroom or hemisphere-shaped crystal grains; and forming a $Ta_2O_5$ film on the silicon film at a pressure of 40 Pa or lower and at a temperature of 480° C. or lower, using a gas obtained by vaporizing $Ta(OC_2H_5)_5$ as a tantalum source gas, wherein the $Ta_2O^5$ film has a thickness, and a variation in the thickness of the $Ta_2O_5$ film is within the range of approximately –3% and +3%.

2. The manufacturing method for a semiconductor device as recited in claim 1, wherein the $Ta_2O_5$ film forming is effected in a hot wall type chemical vapor deposition apparatus.

3. The manufacturing method for a semiconductor device as recited in claim 1, wherein the silicon film forming, comprises:

forming an amorphous silicon film on or above the semiconductor substrate, generating a plurality of crystal nuclei at a plurality of portions of a surface of the amorphous silicon film by heating the amorphous silicon film in an atmosphere including a silicon-containing compound, and growing the crystal nuclei, by heating the amorphous silicon film having the crystal nuclei after terminating the supply of the silicon-containing compound to convert the surface of the amorphous silicon film into the first polycrystalline silicon film halving the mushroom or hemisphere-shaped crystal grains.

4. The manufacturing method for a semiconductor device as recited in claim 1, wherein the silicon film forming, comprises:

forming an amorphous silicon film on or above a semiconductor substrate, generating a plurality of crystal nuclei at a plurality of portions of a surface of the amorphous silicon film by heating the amorphous silicon film in a vacuum or in a gas atmosphere substantially chemically non-reactive to the amorphous silicon film, and growing the crystal nuclei, by heating the amorphous silicon film having the crystal nuclei in a vacuum or in a gas atmosphere substantially chemically non-reactive to the amorphous silicon film, to convert the surface of the amorphous silicon film into the first polycrystalline silicon film having the mushroom or hemisphere-shaped crystal grains.

5. A manufacturing method for a semiconductor device, comprising:

forming an undulating film having a surface with concave-convex structure on or above a semiconductor substrate; and forming a $Ta_2O_5$ film on the undulating film at a pressure of 40 Pa or lower and at a temperature of 480° C. or lower, using a gas obtained by vaporizing $Ta(OC_2H_5)_5$ as a tantalum source gas, wherein the $Ta_2O_5$ film has a thickness, and a variation in the thickness of the $Ta_2O_5$ film is within the range of approximately –3% and +3%.

6. The manufacturing method for a semiconductor device as recited in claim 5, wherein the $Ta_2O_5$ film forming is effected in a hot wall type chemical vapor deposition apparatus.

7. The manufacturing method for a semiconductor device as recited in claim 1, wherein the $Ta_2O_5$ film has a step coverage of at least 85% when an aspect ratio for the $Ta_2O_5$ film is four.

8. The manufacturing method for a semiconductor device as recited in claim 1, wherein the $Ta_2O_5$ film is formed at a pressure greater than or equal to 25 Pa.

9. The manufacturing method for a semiconductor device as recited in claim 1, further comprising forming a second polycrystalline silicon fin on or above the $Ta_2O_5$ film.

10. A manufacturing method for a semiconductor device, comprising:

forming a silicon film on or above a semiconductor substrate, a surface of the silicon film having a first polycrystalline silicon film having mushroom or hemisphere-shaped crystal grains; and forming a $Ta_2O_5$ film on the silicon film at a pressure of 40 Pa or lower and at a temperature of 480° C. or lower, using a gas obtained by vaporizing $Ta(OC_2H_5)_5$ as a tantalum source gas, wherein the silicon film forming includes:

forming an amorphous silicon film on or above the semiconductor substrate, generating a plurality of crystal nuclei at a plurality of portions of a surface of the amorphous silicon film by heating the amorphous silicon film in an atmosphere including a silicon-containing compound, and growing the crystal nuclei, by heating the amorphous silicon film having the crystal nuclei after terminating the supply of the silicon-containing compound to convert the surface of the amorphous silicon film into the polycrystalline silicon film having the mushroom or hemisphere-shaped crystal grains, the crystal nuclei growing being less than or equal to 5 minutes in length.

11. A manufacturing method for a semiconductor device, comprising:

forming a silicon film on or above a semiconductor substrate, a surface of the silicon film having a first polycrystalline silicon film having mushroom or hemisphere-shaped crystal grains; and forming a $Ta_2O_5$ film on the silicon film at a pressure of 40 Pa or lower and at a temperature of 480° C. or lower, using a gas obtained by vaporizing $Ta(OC_2H_5)_5$ as a tantalum source gas, wherein the silicon film forming includes:

forming an amorphous silicon film on or above the semiconductor substrate, generating a plurality of crystal nuclei at a plurality of portions of a surface of the amorphous silicon film by heating the amorphous silicon film in a vacuum or in a gas atmosphere substantially chemically non-reactive to the amorphous silicon film, and growing the crystal nuclei, by heating the amorphous silicon film having the crystal nuclei in a vacuum or in a gas atmosphere substantially chemically non-reactive to the amorphous silicon film, to convert the surface of the amorphous silicon film into the polycrystalline silicon film having he mushroom or hemisphere-shaped crystal grains, the crystal nuclei growing less than or equal to 5 minutes in length.

12. The manufacturing method for a semiconductor device as recited in claim 5, wherein the $Ta_2O_5$ film has a step coverage of at least 85% when an aspect ratio for the $Ta_2O_5$ film is four.

13. The manufacturing method for a semiconductor device as recited in claim 5, wherein the $Ta_2O_5$ film is formed at a pressure greater than or equal to 25 Pa.

14. The manufacturing method for a semiconductor device as recited in claim 5, further comprising forming a second polycrystalline silicon film on or above the $Ta_2O_5$ film.

* * * * *